US009583193B2

(12) United States Patent
Tailliet

(10) Patent No.: US 9,583,193 B2
(45) Date of Patent: Feb. 28, 2017

(54) COMPACT MEMORY DEVICE OF THE EEPROM TYPE WITH A VERTICAL SELECT TRANSISTOR

(71) Applicant: STMicroelectronics (Rousset) SAS, Rousset (FR)

(72) Inventor: François Tailliet, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/864,354

(22) Filed: Sep. 24, 2015

(65) Prior Publication Data

US 2016/0155506 A1 Jun. 2, 2016

(30) Foreign Application Priority Data

Nov. 27, 2014 (FR) ..................................... 14 61549

(51) Int. Cl.

| G11C 11/34 | (2006.01) |
| G11C 16/04 | (2006.01) |
| G11C 16/14 | (2006.01) |
| G11C 16/26 | (2006.01) |
| G11C 16/10 | (2006.01) |
| G11C 16/12 | (2006.01) |
| H01L 27/115 | (2006.01) |

(52) U.S. Cl.
CPC ....... *G11C 16/0483* (2013.01); *G11C 16/0408* (2013.01); *G11C 16/0433* (2013.01); *G11C 16/10* (2013.01); *G11C 16/12* (2013.01); *G11C 16/14* (2013.01); *G11C 16/26* (2013.01); *H01L 27/11534* (2013.01)

(58) Field of Classification Search
None
See application file for complete search history.

(56) References Cited

U.S. PATENT DOCUMENTS

| 5,646,060 A | 7/1997 | Chang et al. |
| 2005/0201187 A1* | 9/2005 | Hofmann ................ H01L 27/28 365/232 |
| 2006/0244041 A1* | 11/2006 | Tanaka ............... G11C 16/0433 257/315 |
| 2007/0064494 A1* | 3/2007 | Morton ............. G11C 16/0416 365/185.28 |
| 2013/0182509 A1* | 7/2013 | Lee .................... G11C 16/3459 365/185.22 |
| 2013/0229875 A1 | 9/2013 | La Rosa et al. |
| 2016/0148697 A1 | 5/2016 | Tailliet |

FOREIGN PATENT DOCUMENTS

WO 0124267 A1 4/2001

* cited by examiner

*Primary Examiner* — Harry W Byrne
*Assistant Examiner* — Sultana Begum
(74) *Attorney, Agent, or Firm* — Slater Matsil, LLP

(57) ABSTRACT

Integrated non-volatile memory device includes an integrated memory cell of the EEPROM type with a floating-gate transistor and a selection transistor connected in series between a source line and a bit line, and a programming circuit for the memory cell. The selection transistor is connected between the floating-gate transistor and the source line. The programming circuit is configured for programming the at least one memory cell with a programming voltage split between a positive voltage and a negative voltage.

30 Claims, 5 Drawing Sheets

FIG.6

Erase

| Column | Row | Data value | BL | WLBL | CG | CSP | SL |
|---|---|---|---|---|---|---|---|
| not selected | not selected | 0 | 0V | Vwle | 3V | 0V | 0V |
| not selected | selected | 0 | 0V | Vwle | 3V | 0V | 0V |
| selected | not selected | 0 | 0V | Vwle | 3V | 0V | 0V |
| selected | selected | 0 | 0V | Vwle | 13V | 0V | 0V |

Programming

| Column | Row | Data value | BL | WLBL | CG | CSP | SL |
|---|---|---|---|---|---|---|---|
| not selected | not selected | X | 0V | 0V | 2V | 0V | 0V |
| not selected | selected | X | 0V | 0V | 2V | 0V | 0V |
| selected | not selected | 0 | 0V | 0V | 2V | 0V | 0V |
| selected | not selected | 1 | 4V | 0V | 2V | 0V | 0V |
| selected | selected | 0 | 0V | 0V | -9V | 0V | 0V |
| selected | selected | 1 | 4V | 0V | -9V | 0V | 0V |

Read

| Column | Row | Data value | BL | WLBL | CG | CSP | SL |
|---|---|---|---|---|---|---|---|
| not selected | not selected | X | floating | 0V | 0V | -1V | 0V |
| not selected | selected | X | 0V or float. | Vwlr | CGread | -1V | 0V |
| selected | not selected | 0 | Vhigh | 0V | 0V | -1V | 0V |
| selected | not selected | 1 | 0V | 0V | 0V | -1V | 0V |
| selected | selected | 0 | Vhigh | Vwlr | CGread | -1V | 0V |
| selected | selected | 1 | 0V | Vwlr | CGread | -1V | 0V |

COMPACT MEMORY DEVICE OF THE EEPROM TYPE WITH A VERTICAL SELECT TRANSISTOR

This application claims priority to French Application No. 1461549, filed on Nov. 27, 2014, which application is hereby incorporated herein by reference.

TECHNICAL FIELD

The present invention relates generally to a system and method, and, in particular embodiments, the invention relates to memories, such as the non-volatile memories of the electrically-erasable and programmable (EEPROM) type.

BACKGROUND

In EEPROM memories, the logical value of a bit stored in a memory element is represented by the value of the threshold voltage of a floating-gate transistor, which can be modified at will by programming or erasing operations. The programming or the erasing of a floating-gate transistor consists of the injection or the extraction of electrical charges into or from the gate of the transistor by tunnel effect ("Fowler-Nordheim" effect) by means of a high writing voltage Vpp which can be of the order of 10 to 20 volts, typically 13 volts.

This high voltage of 13 volts, needed for the writing of EEPROM memories, is non-reducible and is very constraining as regards the fabrication technology and the reliability of the product.

Indeed, lithographic reduction, in other words the increase in the etch resolution, leads to a decrease in the operating voltages, and this high writing voltage becomes more problematic in terms notably of leakages of the source/drain junctions of the transistors and also in terms of breakdown of the gate oxides.

As a consequence, these risks of breakdown and of premature aging of the transistors have a direct impact on the reliability of the product.

One solution, referred to as "split voltage" according to a terminology normally used by those skilled in the art, has been envisaged. More precisely, the high voltage Vpp required for the programming of the memory planes is split between a positive voltage Vpp+ and a negative voltage Vpp− such that the difference (Vpp+−Vpp−) is equal to Vpp. Thus, in such an approach, a voltage Vpp+ of the order of 4 volts and a voltage Vpp− of the order of −9 volts will be chosen.

Such a solution allows the constraint on the voltage capability of the transistors to be relaxed. However, it has the drawback of rendering the fabrication process for the memory planes more complicated since it generally requires a technology known as "triple well" owing to the negative voltage of the order of a few volts. Furthermore, the design of the control is more complicated since it is necessary to provide negative voltage switching operations, which also has a negative impact on the surface area of the memory plane. Indeed, a negative voltage switching element proves to be costly in space in the memory plane (use of PMOS transistors) as regards the control transistors for the control gates of the floating-gate transistors.

SUMMARY

According to one embodiment, a memory device of the type EEPROM is provided that is more compact and compatible with an architecture of the "split-voltage" type.

According to one embodiment, such a memory device is provided that is compatible with a bit granularity, a byte granularity or a page granularity and which operates by "Fowler-Nordheim" effect both during an erase phase and during a programming phase.

According to one aspect, a non-volatile memory device is provided, comprising at least one integrated memory cell of the EEPROM type comprising a floating-gate transistor and a selection transistor (also denoted access transistor or isolation transistor) connected in series between a source line and a bit line, and a programming circuit for programming the at least one memory cell.

According to a general feature of this aspect, the selection transistor is connected between the floating-gate transistor and the source line, and the programming circuit are configured for programming the at least one memory cell with a programming voltage split between a positive voltage and a negative voltage.

The location of the selection transistor on the source side thus allows particularly dense structures to be formed, in particular when the selection transistor is a vertical MOS transistor whose gate region is for example formed within a trench formed within a semiconductor well.

Furthermore, the selection transistor is advantageously not used for selecting the memory cell during programming. Indeed, when the memory device comprises a matrix memory plane, the selection during programming and within a selected column, between two memory cells of the same bit line, one belonging to a selected row and the other belonging to a non-selected row, is then implemented by the floating gate voltage (for example −9 volts for a selected row and +2 volts for a non-selected row) and no longer by the switching or not (depending on whether the row is selected or not) of a voltage on the drain of the floating-gate state transistor.

According to one embodiment, the programming circuit is furthermore configured for carrying out a programming of the memory cell comprising turning off the selection transistor.

The turning off of each selection transistor during the programming allows the return of current towards the source line to be avoided.

During an erase phase, the selection transistor is conducting.

The selection transistor is still used in a read phase and it is only during this operation that it is designed to play a selection role (in other words that its gate voltage depends on the selected state of the row to which it belongs).

Furthermore, its location on the source side allows it to be operated at low voltage which then readily allows its size to be reduced or its structure to be modified.

When the selection transistor is a vertical MOS transistor, the active region of the floating-gate transistor and the active region of the selection transistor are advantageously situated within the same semiconductor well isolated from the rest of the substrate of the integrated circuit by a buried semiconductor layer (for example that commonly denoted by those skilled in the art under the acronym "N iso layer") also forming the source line and the source region of the selection transistor.

This buried layer thus has a dual role, namely to carry the source potential to the selection transistor and to isolate the semiconductor well from ground for the read operation when a negative potential (for example −1 volt) is applied to the well in a read phase.

According to one embodiment, the device comprises a matrix memory plane comprising columns of memory words respectively formed on each row of the memory plane by groups of memory cells.

It is then particularly advantageous for the device to comprise separate source lines respectively associated with the various columns of memory words and designed to receive different voltages depending on whether the column of memory words is selected or not, during a erase-programming cycle of the memory device.

Such an embodiment notably allows compatibility with a grouping within control blocks of control elements, for example inverters, sending commands to the control gates of the floating-gate transistors of the memory cells. Such a grouping is for example described in the French Patent application no. 1461339 with the title: "Compact non-volatile memory device".

Indeed, by grouping together these control elements, the surface area of the memory plane is reduced while at the same time reducing the periodic rupture of the uniformity of the memory plane which notably existed when these control elements were distributed over every other column of the memory plane for example. Moreover, this periodic rupture of the uniformity of the memory plane generally causes variations in behavior of the memory cells close to the control elements.

In an architecture of the "split-voltage" type, it is particularly advantageous for all the NMOS transistors of the inverters of the control block to be disposed within the same first semiconductor well and for all the PMOS transistors of the inverters of the control blocks to be disposed within the same second semiconductor well.

This allows an additional space gain.

However, such a positioning, combined with the aforementioned grouping of control elements, introduces specific electrical constraints that it is possible to overcome by providing for the sources of the state transistors of the memory cells of the same column of memory words to be connected to the same source line, the source lines of the various columns of memory words being separated and designed to receive different voltages depending on whether the column of memory words is selected or not, during a erase-programming cycle of the memory device.

In other words, this allows the source lines to be selectively powered in such a manner as to apply a specific source voltage for a non-selected column and a selected row. Thus, during a erase cycle, for a memory word situated in a selected row and a non-selected column and whose voltage on the control gates of its state transistors is floating within a large range of voltages, the risk of spurious erasing ("disturb") by the application of a voltage to the source line of this memory word is avoided.

One particularly simple way of forming these separate source lines consists for example in providing a buried layer comprising several mutually electrically-isolated parts, each part running under a column of memory words in the direction of the bit lines and forming the source line associated with the column of memory words. Each part of buried layer isolates, from the rest of the substrate, the corresponding semiconductor well containing all the memory cells of the column of memory words, all the semiconductor wells being furthermore mutually electrically isolated.

BRIEF DESCRIPTION OF THE DRAWINGS

Other advantages and features of the invention will become apparent upon examining the detailed description of non-limiting embodiments and the appended drawings in which:

FIGS. 2 to 8 illustrate schematically various embodiments of a memory device according to the invention.

DETAILED DESCRIPTION OF ILLUSTRATIVE EMBODIMENTS

Figure 1:
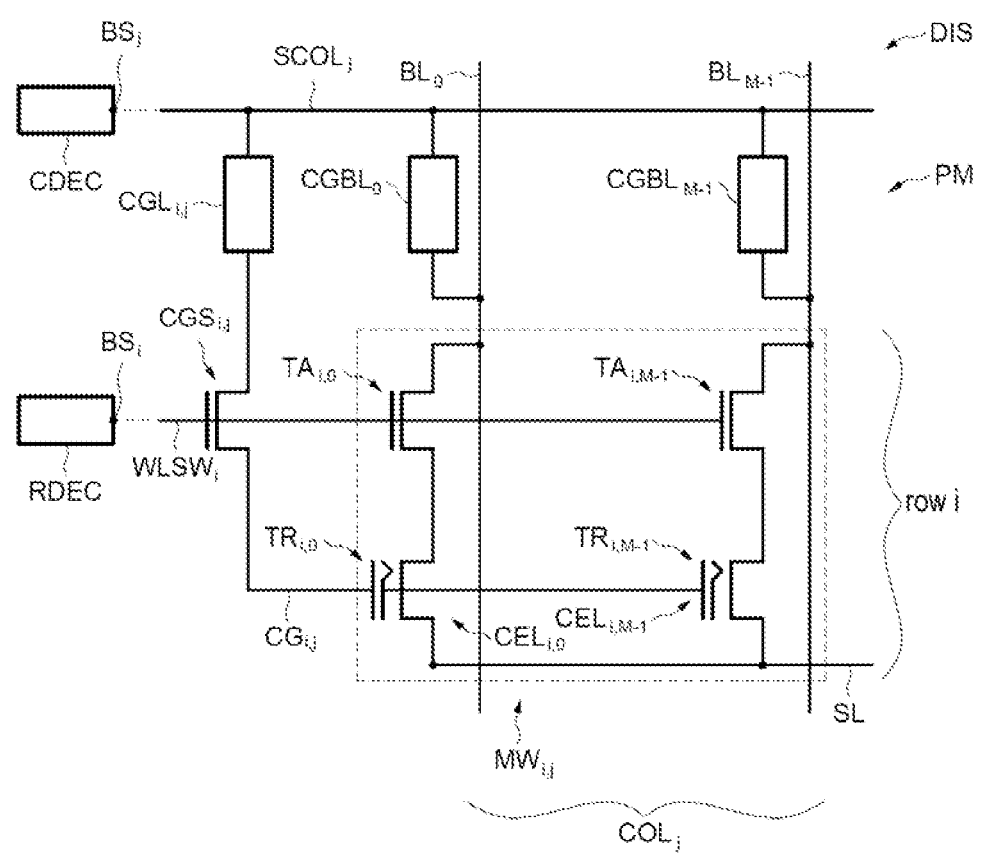
FIG. 1 illustrates schematically one example of an EEPROM memory device of the prior art.

FIG. 1 illustrates one example of a memory device DIS of the type EEPROM. The device comprises a memory plane PM comprising memory cells CEL connected to row selection lines delivering signals WLSWi and to bit lines BL.

The bit lines are grouped into columns $COL_j$ here comprising M bit lines $BL_0$-$BL_{M-1}$.

M can for example be equal to 38, thus corresponding to words of 32 useful bits (4 bytes) accompanied by 6 bits of error corrector code (ECC).

The memory cells connected to the same selection line form a word line and the memory cells $CEL_{i,k}$ (k varying from 0 to M−1) of the same word line connected to the M bit lines of a column $COL_j$ form a memory word $MW_{i,j}$ allowing M bits to be stored.

For the sake of simplification, a single word $MW_{i,j}$ belonging to a column $COL_j$ and to a row i is shown in FIG. 1.

Each memory cell $CEL_{i,k}$ comprises a floating-gate state transistor $TR_{i,k}$ and a access transistor (or selection transistor or isolation transistor) $TA_{i,k}$ of the MOS type. The transistor $TA_{i,k}$ is controlled on its gate by the signal $WLSW_i$. Its drain is connected to the corresponding bit line BL and its source is connected to the drain of the floating-gate transistor $TR_{i,k}$.

A control element $CGS_{i,j}$, here an MOS transistor, is also controlled on its gate by the signal $WLSW_i$ and delivers a control signal $CG_{i,j}$ to the control gates of all the floating-gate transistors $TR_{i,k}$ of the column $COL_j$ (the memory word).

The signal $WLSW_i$ is delivered to the output terminal $BS_i$ of a row decoder RDEC.

The transistor $CGS_{i,j}$ is furthermore connected to a column selection line $SCOL_j$ connected to the output $BS_j$ of a column decoder CDEC by means of a column latch $CGL_j$.

Furthermore, each bit line $BL_k$ of the column $COL_j$ is connected to the row $SCOL_j$ by means of a bit line latch $CGBL_k$.

Each bit line is also conventionally connected to a read amplifier by a column selection transistor, of a read transistor and of a multiplexing bus (these elements not being shown in FIG. 1 for the sake of simplification). The column selection transistors are controlled by the column selection signal $SCOL_j$, whereas the read transistors are controlled by a read signal. The read amplifiers, connected at the input of the multiplexing bus and at the output to another bus, allow the M bits of a memory word to be read.

Lastly, the sources of the floating-gate transistors TR of the cells are connected to a source line SL.

In a conventional memory plane architecture, there is one column of control elements $CGS_{i,j}$ per column $COL_j$, in other words, per memory word.

Figure 2:
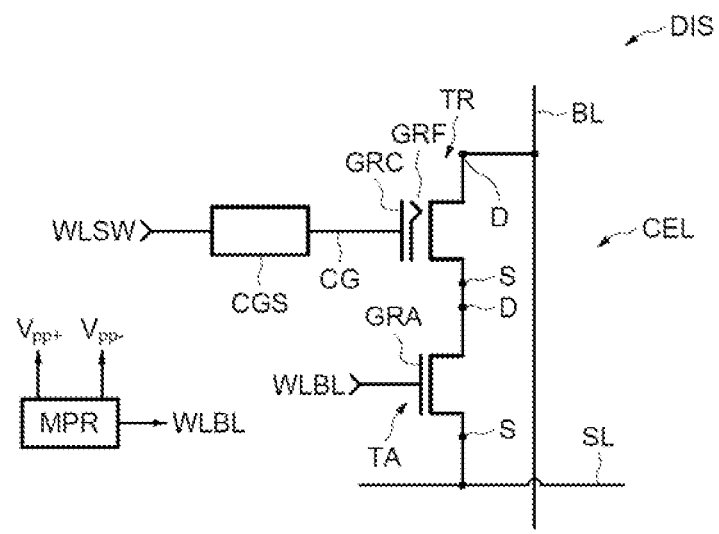

With respect to a memory cell CEL of the prior art, such as that illustrated in FIG. 1, a memory cell CEL according to one embodiment of the invention comprises, as illustrated in FIG. 2, the selection transistor TA connected between the floating-gate transistor TR and the source line SL.

More precisely, in the example in FIG. 2, the source S of the selection transistor TA is connected to the source line SL, whereas its drain D is connected to a first conduction electrode, for example the source S, of the floating-gate transistor TR.

The other conduction electrode, for example the drain D, of the floating-gate transistor TR is connected to the bit line BL.

The control gate GRC of the floating-gate transistor TR receives the signal CG from a control element CGS which can be of any known type, for example a inverter. The control electrode of the control element CGS is controlled by the signal WLSW delivered by the row decoder.

Furthermore, the gate GRA of the access transistor TA is controlled by a signal WLBL also emanating from the row decoder.

In the embodiment in FIG. 2, the signals WLBL and WLSW are separate signals.

This allows the risk of breakdown of the gate oxide of the access transistor to be reduced.

It may technically be envisaged for these signals WLSW and WLBL to be one and the same signal. This would simplify the architecture and the physical implementation but would induce higher voltages on the gate of the selection transistor TA or of the transistors of the control element CGS, thus risking a accelerated aging of these transistors, an unfavorable shift in their characteristics, or even their breakdown.

The memory device DIS also comprises programming circuit MPR, with a structure known per se, configured for programming the cell CEL with a programming voltage split between a positive voltage $V_{pp+}$ and a negative voltage $V_{pp-}$.

More precisely, the writing of a data value into the cell comprises a erasing of the cell followed by a programming of the cell. and for programming a data value equal to "1" in a erased cell (containing a "0"), the voltage $V_{pp+}$ (for example 4 volts) is applied to the bit line BL and the voltage $V_{pp-}$ (for example −9 volts) to the control gate GRC of the transistor TR (the voltage $V_{pp-}$ is the signal CG), so as to obtain a suitable programming voltage (for example 13 volts).

It is not necessary to use the selection transistor TA for the programming of the cell, because the selection of the cell is carried out by means of the voltage on the floating gate (−9 volts for the selected cell and 2 volts for the non-selected cell). Also, the programming circuit MPR is configured to turn off the transistor TA by delivering a zero voltage WLBL to the gate GRA of this transistor.

The selection transistor TA is however still used in a read phase where it plays its selection role and its location on the source side allows it to be operated at a low voltage, which then allows its size to be reduced or its structure to be modified.

Placing the selection transistor TA on the source side, therefore allows the memory cell CEL to be densified.

Figure 3:
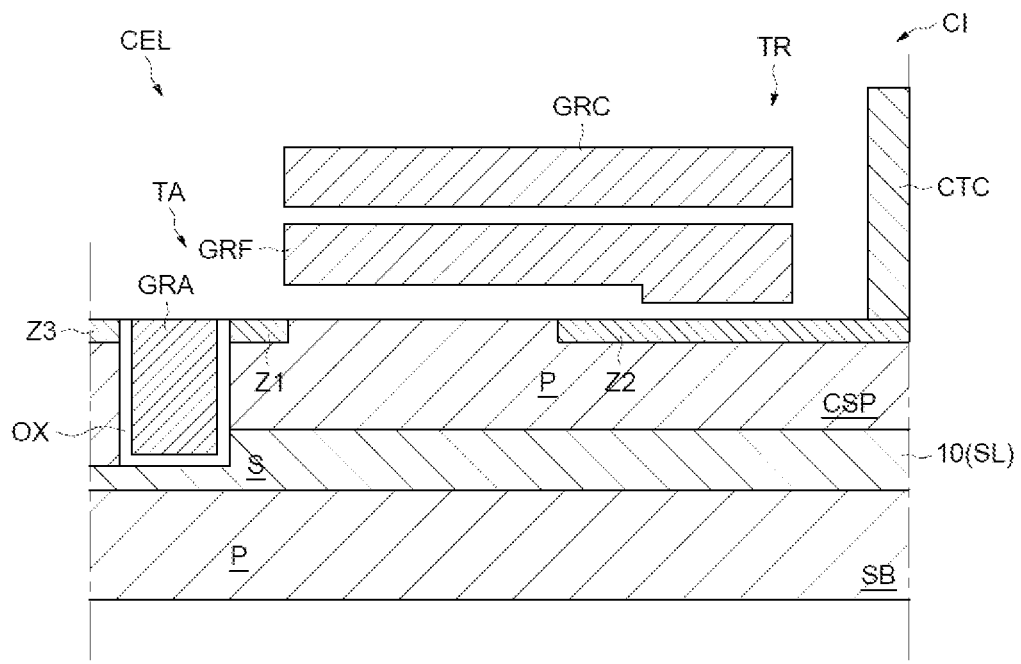
Figure 4:
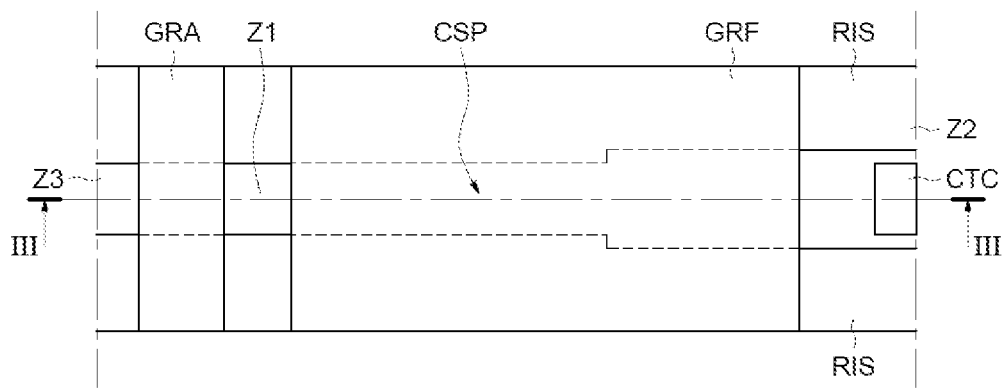

This densification is further enhanced when the selection transistor TA is a vertical transistor such as that illustrated schematically in FIGS. 3 and 4, FIG. 3 being the cross-section along the line III-III of FIG. 4.

In these figures, the active region of the floating-gate transistor TR and the active region of the selection transistor TA are situated within the same semiconductor well CSP, here a well of conductivity P, isolated from the rest of the substrate SB of the integrated circuit by a buried semiconductor layer 10 (commonly denoted by those skilled in the art using the term N ISO layer) of the N type of conductivity, this layer 10 forming the source line SL and the source region S of the selection transistor TA.

The well CSP is also isolated laterally by an insulating region RIS for example of the shallow trench isolation (or STI) type.

The transistor TA also comprises a vertical semiconductor region GRA, forming the gate region of this transistor, isolated from the well CSP and from the buried layer by a gate oxide OX.

In practice, this gate region is formed by etching of a trench in the substrate SB, oxidation of the walls of the trench and filling with polysilicon for example.

As a variant, the region GRA could be made of metal.

The cell CEL furthermore comprises a first semiconductor region Z1, here doped N+, in other words of the same type of conductivity as that of the source line 10, and forming both the drain region of the selection transistor TA and a first conduction electrode of the floating-gate transistor TR.

Another portion of active region Z3 is disposed on the other side of the gate region GRA. It results from the breakthrough of the active region for the formation of the trench and it is electrically inactive for the cell.

The well CSP furthermore comprises a second semiconductor region Z2, of the same type of conductivity as that of the source line, in this case an N+ doped region, forming a second conduction electrode of the floating-gate transistor, this region Z2 being electrically coupled to the bit line BL by a metal contact CTC.

Similarly, the gate region GRA is electrically coupled to the word line carrying the signal WLBL by a contact not shown here for the sake of simplification.

Figure 5:
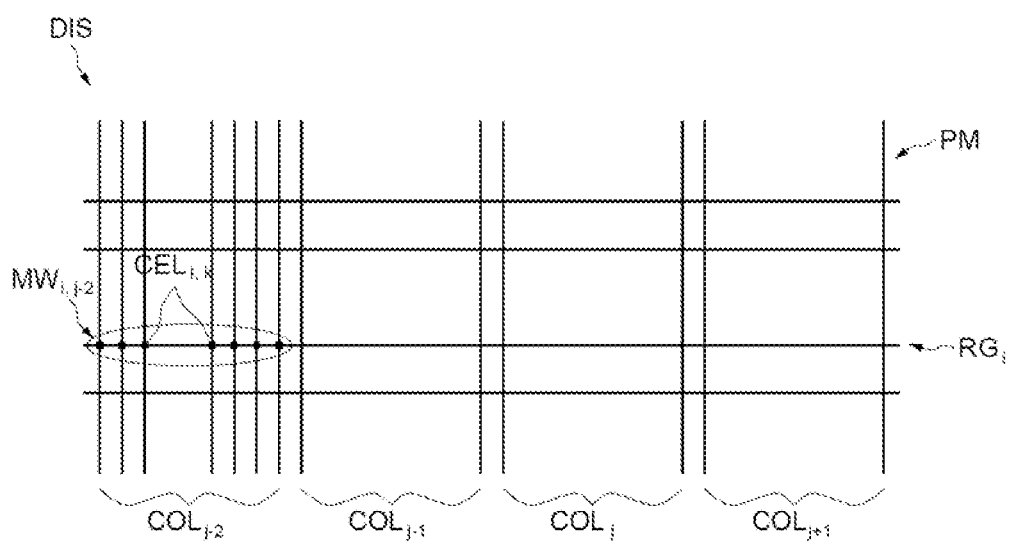

Although only one cell CEL has been shown in FIGS. 2 to 4, the memory device DIS generally comprises (FIG. 5) a matrix memory plane PM comprising columns $COL_j$ of memory words $MW_{i,j}$ respectively formed on each row $RG_i$ of the memory plane by groups of memory cells $CEL_{i,k}$ (k varying for example from 0 to M−1 for memory words of M bits).

FIG. 6 shows three tables indicating the various values of the various signals in the operations for erasing, for programming and for reading the memory plane in the case where each control element $CGS_{i,j}$ is for example a inverter, differentiating the case where a column is selected or not selected in combination with the case where a row is selected or not selected and for each possible logical value (0 or 1) of a data value to be programmed or to be read.

In these tables, the column BL denotes, by misuse of language, the voltage on the bit line BL and the column CSP denotes the biasing of the well CSP.

As far as the erase operation is concerned, Vwle denotes the value of the signal WLBL in this operation in order to make the selection transistor conduct. By way of example, Vwle can be of the order of 1 volt to 5 volts and could be directly the power supply voltage Vdd of the device.

As far as the read operation is concerned, Vwlr denotes the value of the signal WLBL in this operation in order to make the selection transistor conduct, CGread denotes the read voltage applied to the control gate of the floating-gate transistor of a cell and Vhigh denotes the value of the voltage present on the bit line BL when a logical "0" is being read.

Figures 7, 8:
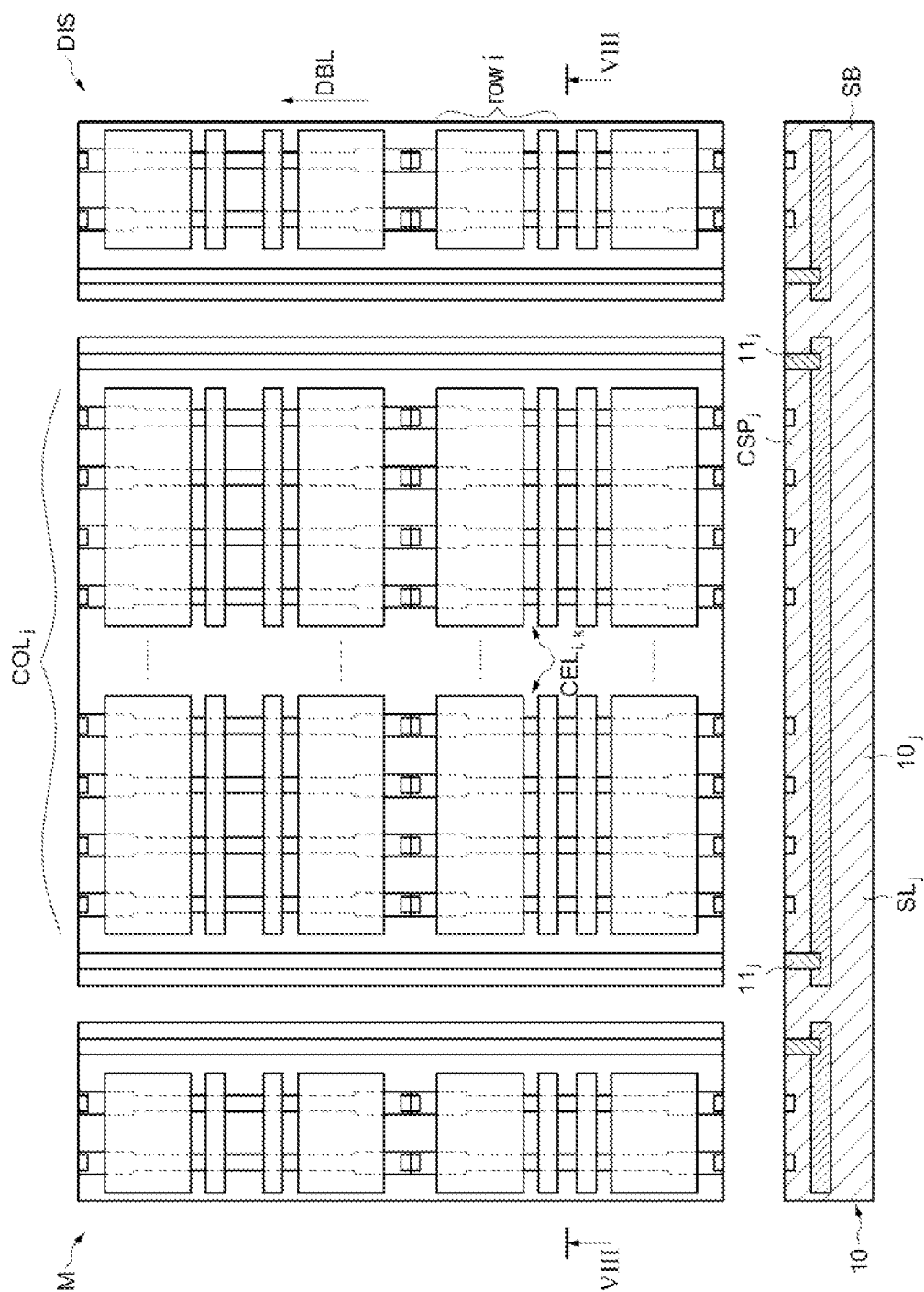

FIG. 7, which is a top view of one particular exemplary embodiment of the memory plane PM of a memory device DIS, and FIG. 8, which is a cross-section along the line VIII-VIII in FIG. 7, exhibit an architecture in which separate source lines SLj are respectively associated with the various columns COLj of memory words of the memory plane and are designed to receive different voltages depending on whether the column of memory words is selected or not, during an erase-programming cycle of the memory device.

For this purpose, the buried layer 10 comprises several parts 10j that are mutually electrically isolated, each part running under a column of memory words COLj in the direction DBL of the bit lines. Each part 10j forms the source line associated with the column COLj of memory words and isolates the corresponding semiconductor well CSPj from the rest of the substrate SB.

The semiconductor well CSPj contains all the memory cells of the column COLj of memory words. All the semiconductor wells (CSPj) are furthermore mutually electrically isolated, for example by N doped wells 11j.

Such an architecture is, as indicated hereinbefore, compatible with a grouping of control elements $CGS_{i,j}$ within control blocks in combination with a split-voltage architecture in which all the transistors N of the control elements (inverters for example) grouped together are situated within the same first semiconductor well and in which the P transistors of the grouped inverters are also situated within the same second semiconductor well. Such an architecture using a split voltage and grouped control elements is for example described in the aforementioned French Patent application No. 1461339.

As can be seen in the table in FIG. 6, the bit lines of a selected column when programmed with a logical "1" are at 4 volts, whereas those of a non-selected column are at 0 volts.

However, it is possible for the proximity of such selected bit lines at 4 volts and non-selected ones at 0 volt during programming to create leaks which can be significant.

It is possible to reduce these leaks, or even to eliminate them, if the programming circuit is further configured for applying a substrate effect during programming.

This substrate effect may be obtained either by a negative pumping of the bias voltage of the well CSP (for example –1 volt) or by offsetting the voltages between the selected bit lines and the non-selected bit lines.

Thus, for example, the bit line of a selected column will be set at 5 volts during the programming of a logical "1", instead of 4 volts whereas the bit line of a non-selected column will be set at 1 volt instead of 0 volt. The voltage CG applied during a programming phase is then –8 volts instead of –9 volts.

What is claimed is:

1. An integrated non-volatile memory device, comprising:
   a source line;
   a bit line;
   an EEPROM-type memory cell disposed within a semiconductor substrate, the EEPROM-type memory cell comprising a floating-gate transistor and a selection transistor coupled in series between the source line and the bit line, the selection transistor comprising a vertical MOS transistor that is connected between the floating-gate transistor and the source line; and
   a programming and erasing circuit coupled to the EEPROM-type memory cell, the programming and erasing circuit configured to program the EEPROM-type memory cell with a programming voltage split between a positive voltage and a negative voltage, and configured to electronically erase the EEPROM-type memory cell, wherein the programming voltage is applied between a control gate of the floating-gate transistor and the bit line.

2. The device according to claim 1, wherein the floating-gate transistor and the selection transistor each have an active region located within the same semiconductor well, the active regions of the floating-gate transistor and the selection transistor being isolated from the rest of the semiconductor substrate by a buried semiconductor layer that also forms the source line and a source region of the selection transistor.

3. The device according to claim 2, wherein the semiconductor well comprises a vertical region forming a gate region of the selection transistor.

4. The device according to claim 3, wherein the semiconductor well comprises a first semiconductor region of the same type of conductivity as that of the source line, the first semiconductor region forming a drain region of the selection transistor and a first conduction electrode of the floating-gate transistor.

5. The device according to claim 4, wherein the semiconductor well further comprises a second semiconductor region of the same type of conductivity as that of the source line, the second semiconductor region forming a second electrode of the floating-gate transistor electrically coupled to the bit line.

6. The device according to claim 1, wherein the programming and erasing circuit is configured to carry out a programming of the EEPROM-type memory cell by turning off the selection transistor.

7. The device according to claim 1, wherein the selection transistor is designed to play a selection role only during a read operation of the EEPROM-type memory cell.

8. The device according to claim 1, wherein the programming and erasing circuit is further configured to apply a substrate effect during programming.

9. An integrated non-volatile memory device, comprising:
   a semiconductor substrate;
   a plurality of source lines buried within the semiconductor substrate, each source line isolating a well region within the semiconductor substrate, each well region being electrically isolated from other well regions;
   a plurality of bit lines;
   a plurality of EEPROM-type memory cell disposed within the semiconductor substrate in a matrix memory plane arranged in rows and columns, each column of memory cells disposed within an associated one of the well regions, each memory cell comprising a floating-gate transistor and a vertical MOS selection transistor coupled in series between a respective source line and a respective bit line, the selection transistor being connected between the floating-gate transistor and the respective source line; and
   a programming circuit coupled to the memory cells, the programming circuit configured to program a selected memory cell with a programming voltage, wherein the programming voltage is split between a positive voltage and a negative voltage and the programming voltage is applied between a control gate of the floating-gate transistor and the bit line.

10. The device according to claim 9, wherein columns of memory words are respectively formed on each row of the memory plane by groups of memory cells.

11. The device according to claim 9, wherein the source lines are designed to receive various voltages depending on whether an associated column of memory words is selected or not during an erase-programming cycle of the memory device.

12. The device according to claim 9, wherein the floating-gate transistor and the selection transistor of each memory cell in a given column has an active region located within the well region associated with that column.

13. The device according to claim 1, wherein active regions of the floating-gate transistor and the selection transistor of the EEPROM-type memory cell are isolated from other active regions by a buried semiconductor layer.

14. The device according to claim 9, wherein each selection transistor comprises a source region that is part of a buried semiconductor layer.

15. The device according to claim 13, wherein the buried semiconductor layer comprises a plurality of mutually electrically-isolated portions, each portion running under a column of memory words in the direction of the bit lines and forming the source line associated with the column of memory words.

16. The device according to claim 15, wherein each portion of the buried semiconductor layer isolates the rest of the semiconductor substrate into a corresponding semiconductor well that contains all the memory cells of the column of memory words, wherein all the semiconductor wells are mutually electrically isolated.

17. The device according to claim 9, wherein the programming circuit is configured to carry out a programming of a selected memory cell by turning off the selection transistor of the selected memory cell.

18. The device according to claim 9, wherein the selection transistor of a selected memory cell is designed to play a selection role only during a read operation of the selected memory cell.

19. The device according to claim 9, wherein the programming circuit is further configured to apply a substrate effect during programming.

20. An integrated non-volatile memory device, comprising:
an EEPROM-type integrated memory cell that comprises a floating-gate transistor and a selection transistor connected in series between a source line and a bit line, wherein the selection transistor is connected between the floating-gate transistor and the source line; and
means for programming the memory cell with a programming voltage that is split between a positive voltage and a negative voltage, the means for programming coupled to the memory cell so that the programming voltage is applied between a control gate of the floating-gate transistor and the bit line.

21. The device according to claim 20, wherein the selection transistor comprises a vertical MOS transistor.

22. The device according to claim 20, wherein the means for programming comprises means for programming the memory cell by turning off the selection transistor.

23. The device according to claim 20, wherein the selection transistor is designed to play a selection role only during a read operation of the memory cell.

24. The device according to claim 20, wherein the means for programming further comprises means for applying a substrate effect during programming.

25. The device according to claim 9, wherein each selection transistor comprises:
a vertical gate region formed within an opening in the semiconductor substrate and insulated therefrom, the vertical gate region extending from a first edge of the opening adjacent the floating-gate transistor to an opposite second edge of the opening;
a buried semiconductor region of a first semiconductor type electrically connected to the source line;
a first semiconductor region of the first semiconductor type disposed at the first edge of the of the opening, the first semiconductor region electrically connected to the floating-gate transistor;
a second semiconductor region of a second semiconductor type that is opposite the first semiconductor type, the second semiconductor region disposed in the semiconductor substrate and extending from the first semiconductor region to the buried semiconductor region along a sidewall of the opening; and
a third semiconductor region of the first semiconductor type disposed at the second edge of the opening, the third semiconductor region being electrically inactive.

26. A method of operating a memory cell in a memory device that has an array of EEPROM-type memory cells arranged in rows and columns, a plurality of source lines and a plurality of bit lines, each memory cell comprising a floating-gate transistor having a control gate and a selection transistor coupled in series between a respective source line and a respective bit line, the selection transistor connected between the floating-gate transistor and the respective source line, the floating-gate transistor and the selection transistor each having an active region located within a shared semiconductor well, the method comprising:
programming the memory cell, wherein programming the memory cell happens when
a first voltage is applied to the control gate of the floating-gate transistor of a selected memory cell,
a second voltage is applied to the control gate of the floating-gate transistor of a non-selected memory cell,
the selection transistor of the selected memory cell is turned off,
the selection transistor of the non-selected memory cell is turned off,
a fifth voltage is applied to the shared semiconductor well of the selected memory cell, and
the fifth voltage is applied to the shared semiconductor well of the non-selected memory cell; and
erasing the memory cell, wherein erasing the memory cell happens when
a third voltage is applied to the control gate of the floating-gate transistor of the selected memory cell, and
a fourth voltage is applied to the control gate of the floating-gate transistor of the non-selected memory cell,
wherein the first voltage, the second voltage, the third voltage, and the fourth voltage are all different from each other.

27. The method of claim 26, further comprising reading the memory cell, wherein reading the memory cell happens when
the selection transistor of the selected memory cell is turned on;
a sixth voltage is applied to the shared semiconductor well of the selected memory cell; and
the sixth voltage is applied to the shared semiconductor well of the non-selected memory cell, wherein the sixth voltage is different than the fifth voltage.

28. The method of claim 27, wherein the sixth voltage is lower than the fifth voltage.

29. The method of claim 26, wherein the first voltage is below zero and the second voltage is above zero.

30. The method of claim 26, wherein the first voltage is below the fifth voltage and the second voltage is above the fifth voltage.

* * * * *